US009872384B2

(12) United States Patent
Braley et al.

(10) Patent No.: US 9,872,384 B2
(45) Date of Patent: Jan. 16, 2018

(54) ELONGATED, ULTRA HIGH CONDUCTIVITY ELECTRICAL CONDUCTORS FOR ELECTRONIC COMPONENTS AND VEHICLES, AND METHODS FOR PRODUCING THE SAME

(71) Applicant: The Boeing Company, Chicago, IL (US)

(72) Inventors: Daniel Joseph Braley, St. Peters, MO (US); John Huntley Belk, St. Louis, MO (US); Zeaid F. Hasan, St. Louis, MO (US); Minas H. Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 15/158,274

(22) Filed: May 18, 2016

(65) Prior Publication Data

US 2017/0339787 A1 Nov. 23, 2017

(51) Int. Cl.
*H05K 1/09* (2006.01)
*H01B 1/02* (2006.01)
(Continued)

(52) U.S. Cl.
CPC ............... *H05K 1/09* (2013.01); *C22C 9/00* (2013.01); *C22C 26/00* (2013.01); *C22C 30/02* (2013.01);
(Continued)

(58) Field of Classification Search
CPC ...... H05K 1/09; H01B 13/14; H01B 13/0036; C22C 9/00; C22C 26/00; C22C 30/02; C22C 2023/002
(Continued)

(56) References Cited

U.S. PATENT DOCUMENTS

| 4,565,649 A | 1/1986 | Vogel |
| 4,915,925 A * | 4/1990 | Chung .................... D01F 11/14 |
| | | 252/378 R |

(Continued)

OTHER PUBLICATIONS

U.S. Appl. No. 15/014,096, filed Feb. 3, 2016, Tanielian.
(Continued)

*Primary Examiner* — William H Mayo, III
(74) *Attorney, Agent, or Firm* — DASCENZO Intellectual Property Law, P.C

(57) ABSTRACT

Elongated, ultra-high conductivity electrical conductors for use in advanced electronic components and vehicles, and methods for producing the same, are disclosed herein. The elongated electrical conductors include a conductor body that defines a longitudinal axis. The conductor body includes an isotropically conductive matrix material and a plurality of anisotropically conductive particles interspersed within the isotropically conductive matrix material. Each anisotropically conductive particle defines a respective axis of enhanced electrical conductivity that is aligned with the longitudinal axis of the conductor body. The methods include providing a bulk matrix-particle composite that includes the isotropically conductive matrix material and the plurality of anisotropically conductive particles. The methods further include forming the bulk matrix-particle composite into an elongated electrical conductor and aligning the plurality of anisotropically conductive particles such that the respective axis of enhanced electrical conductivity thereof is at least substantially aligned with the longitudinal axis of the elongated electrical conductor.

21 Claims, 5 Drawing Sheets

(51) Int. Cl.
*H01B 13/14* (2006.01)
*H01B 13/00* (2006.01)
*C22C 9/00* (2006.01)
*C22C 26/00* (2006.01)
*C22C 30/02* (2006.01)

(52) U.S. Cl.
CPC ......... *H01B 1/026* (2013.01); *H01B 13/0036* (2013.01); *H01B 13/14* (2013.01); *C22C 2026/002* (2013.01)

(58) Field of Classification Search
USPC ..... 174/74 R, 78, 84 R, 84 C, 110 R, 117 R, 174/117 F, 117 FF
See application file for complete search history.

(56) References Cited

U.S. PATENT DOCUMENTS

| | | | |
|---|---|---|---|
| 5,397,863 A * | 3/1995 | Afzali-Ardakani | C08K 3/04 174/258 |
| 6,875,374 B1 | 4/2005 | Zhan et al. | |
| 7,651,766 B2 | 1/2010 | Chen | |
| 7,897,876 B2 | 3/2011 | Tsotsis et al. | |
| 8,263,843 B2 | 9/2012 | Kim et al. | |
| 8,445,788 B1 | 5/2013 | Tsotsis et al. | |
| 8,813,352 B2 | 8/2014 | Huang et al. | |
| 8,853,540 B2 | 10/2014 | Adriaenssens | |
| 8,991,028 B2 | 3/2015 | Kim et al. | |
| 9,095,941 B2 | 8/2015 | Kim et al. | |
| 2005/0169830 A1 | 8/2005 | Richard et al. | |
| 2011/0017509 A1* | 1/2011 | Galletti | H01B 1/24 174/74 R |
| 2011/0226509 A1 | 9/2011 | Kim et al. | |
| 2015/0194241 A1 | 7/2015 | Tanielian | |

OTHER PUBLICATIONS

Zhang et al., "*Growth of Half-Meter Long Carbon Nanotubes Based on Schulz-Flory Distribution*," ACS Nano, 7 (7), pp. 6156-6161, Jun. 27, 2013.

Behabtu et al., "*Strong, Light, Multifunctional Fibers of Carbon Nanotubes with Ultrahigh Conductivity*," Science, vol. 339, pp. 182-186, Jan. 11, 2013.

Tongay et al., "*Supermetallic conductivity in bromine-intercalated graphite*," Physical Review, B 81, 115428, 2010.

Nobuya Banno and Takao Takeuchi, "Enhancement of Electrical Conductivity of Copper/Carbon-Nanotube Composite Wire," J. Japan Inst. Metals, vol. 73, No. 9, (2009), pp. 651-658.

European Patent Office, Extended European Search Report for related European Application No. 17161457, Nov. 7, 2017.

* cited by examiner

ELONGATED, ULTRA HIGH CONDUCTIVITY ELECTRICAL CONDUCTORS FOR ELECTRONIC COMPONENTS AND VEHICLES, AND METHODS FOR PRODUCING THE SAME

FIELD

The present disclosure relates to elongated, ultra-high conductivity electrical conductors for use in advanced electronic components and vehicles, as well as the methods for producing the elongated, ultra-high conductivity electrical conductors.

BACKGROUND

Electrical conductors are often utilized to conduct an electric current. Such electrical conductors are generally manufactured from high-conductivity or low-resistivity metals, and may be referred to herein as metallic electrical conductors. Examples of such metals include copper, aluminum, silver, and/or gold.

While metallic electrical conductors may be effective at conducting electric currents, there may be applications in which alternative and/or improved electrical conductors may be beneficial. As an example, metallic electrical conductors may be heavy, with the above-listed metals having densities between 2.7 and 19.3 grams per cubic centimeter. As another example, it may be desirable to utilize electrical conductors with a greater electrical conductivity (or lower resistivity) than what may be achieved, or at least economically achieved, utilizing metallic electrical conductors, especially considering the high cost of noble metals. As yet another example, metallic electrical conductors may not be amenable to certain manufacturing processes.

As a more specific example, commercial airliners may include many miles of electrical conductors, and these many miles of electrical conductors may add significantly to the weight of the commercial airliner. As such, even incremental increases in electrical conductivity and/or incremental decreases in density may significantly impact the weight of the commercial airliner. Thus, there exists a need for lower weight and more conductive electrical conductors, including the development of methods to more easily manufacture the improved electrical conductors. Lower weight and more conductive electrical conductors with decreased costs when compared to those produced with noble metals have benefits in electronic components, including but not limited to circuit boards. Vehicles that include and/or utilize high performance electrical conductors, such as but not limited to aerospace platforms, can also benefit from the increased performance of a more conductive electrical conductor, at lower weight and cost than currently available options.

SUMMARY

Elongated, ultra-high conductivity electrical conductors for use in advanced electronic components and vehicles, as well as the methods for producing the elongated, ultra-high conductivity electrical conductors, are disclosed herein. The elongated, ultra-high conductivity electrical conductors include a conductor body that defines a longitudinal axis. The conductor body includes an isotropically conductive matrix material and a plurality of anisotropically conductive particles interspersed within the isotropically conductive matrix material. Each anisotropically conductive particle defines a respective axis of enhanced electrical conductivity that is at least substantially aligned with the longitudinal axis of the conductor body.

The methods include providing a bulk matrix-particle composite that includes an isotropically conductive matrix material and a plurality of anisotropically conductive particles. Each of the anisotropically conductive particles defines a respective axis of enhanced electrical conductivity along which an electrical conductivity of the anisotropically conductive particle is greater than the electrical conductivity of the anisotropically conductive particle in at least one other direction. The methods further include forming the bulk matrix-particle composite into an elongated electrical conductor and aligning the plurality of anisotropically conductive particles such that the axis of enhanced electrical conductivity thereof is at least substantially aligned with the longitudinal axis of the elongated electrical conductor.

DESCRIPTION

Figure 1:
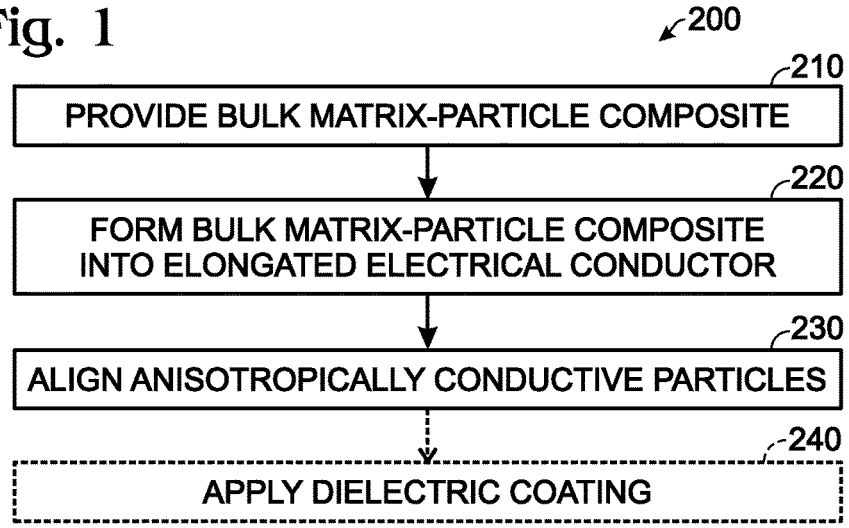
FIG. 1 is a flowchart depicting methods of defining an elongated electrical conductor, according to the present disclosure.

FIGS. 1-15 provide examples of elongated electrical conductors 100 according to the present disclosure, of methods of defining the elongated electrical conductors, and/or of electronic components that include and/or utilize the elongated electrical conductors. Elements that serve a similar, or at least substantially similar, purpose are labeled with like numbers in each of FIGS. 1-15, and these elements may not be discussed in detail herein with reference to each of FIGS. 1-15. Similarly, all elements may not be labeled in each of FIGS. 1-15, but reference numerals associated therewith may be utilized herein for consistency. Elements, components, and/or features that are discussed herein with reference to one or more of FIGS. 1-15 may be included in and/or utilized with any of FIGS. 1-15 without departing from the scope of the present disclosure.

In general, elements that are likely to be included in a given (i.e., a particular) embodiment are illustrated in solid lines, while elements that are optional to a given embodiment are illustrated in dashed lines. However, elements that are shown in solid lines are not essential to all embodiments, and an element shown in solid lines may be omitted from a given embodiment without departing from the scope of the present disclosure.

FIG. 1 is a flowchart depicting methods 200 of defining an elongated electrical conductor, according to the present disclosure. Methods 200 include providing a bulk matrix-particle composite at 210, forming the bulk matrix-particle composite into an elongated electrical conductor at 220, and aligning anisotropically conductive particles at 230. Methods 200 further may include applying a dielectric coating at 240.

Figure 2:
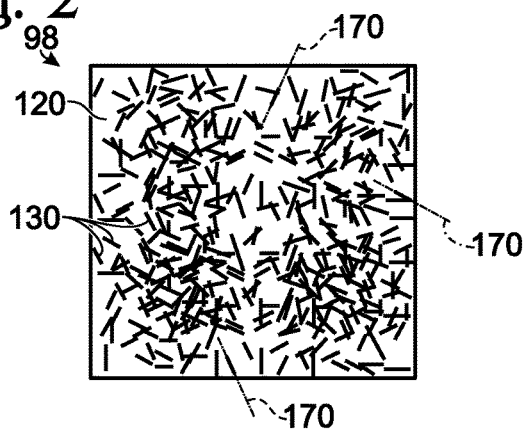
FIG. 2 is a schematic representation of a bulk matrix-particle composite according to the present disclosure.

Providing the bulk matrix-particle composite at 210 may include providing any suitable bulk matrix-particle composite that includes both an isotropically conductive, or at least substantially isotropically conductive, matrix material and a plurality of anisotropically conductive particles. An example of such a bulk matrix-particle composite is illustrated in FIG. 2 at 98. As illustrated therein, the providing at 210 may include providing bulk matrix-particle composite 98 that includes an isotropically conductive matrix material 120 and a plurality of anisotropically conductive particles 130.

Each anisotropically conductive particle 130 includes, defines, and/or has a respective axis of enhanced electrical conductivity 170, as illustrated in dash-dot lines. The electrical conductivity of each anisotropically conductive particle 130 may be greater along, as measured along, and/or in a direction of, axis of enhanced electrical conductivity 170 when compared to the electrical conductivity of the anisotropically conductive particle along, as measured along, and/or in a direction of, at least one other axis and/or direction. Stated another way, the electrical conductivity of anisotropically conductive particles 130 differs depending upon a direction in which electrical current is conveyed through the anisotropically conductive particles, and axis of enhanced electrical conductivity 170 may indicate a direction of greater, or even of maximum, electrical conductivity when compared to one or more other axes and/or directions.

FIGS. 2, 5-11, and 13 illustrate anisotropically conductive particles 130 as lines. However, and as discussed in more detail herein, anisotropically conductive particles 130 are not, necessarily, linear particles. Instead, FIGS. 2, 5-11, and 13 illustrate anisotropically conductive particles 130 as lines to indicate, or illustrate, axis of enhanced electrical conductivity 170 of each anisotropically conductive particle 130. Stated another way, in FIGS. 2, 5,11, and 13, and for illustration, axis of enhanced electrical conductivity 170 of each anisotropically conductive particle 130 extends along, at least substantially along, parallel with, and/or at least substantially parallel with the length, or longitudinal axis, of the line that illustrates anisotropically conductive particle 130.

The providing at 210 may include providing a bulk matrix-particle composite 98 in which axis of enhanced electrical conductivity 170 of the plurality of anisotropically conductive particles 130 is randomly, or at least substantially randomly, distributed within bulk matrix-particle composite 98. Stated another way, the bulk electrical conductivity of bulk matrix-particle composite 98 may be uniform, at least substantially uniform, isotropic, and/or at least substantially isotropic even though the electrical conductivity of the individual anisotropically conductive particles 130 that are included in bulk matrix-particle composite 98 is anisotropic. However, this is not required, and it is within the scope of the present disclosure that anisotropically conductive particles 130 in bulk matrix-particle composite 98 may exhibit some order and/or may not be entirely randomly distributed. Additionally or alternatively, the bulk electrical conductivity of bulk matrix-particle composite 98 may exhibit some level of anisotropy, or direction-dependence. As an example, the axis of enhanced electrical conductivity of the plurality of anisotropically conductive particles may, on average, be at least partially aligned with any suitable alignment axis during the providing at 210.

Bulk matrix-particle composite 98 also may be referred to herein as a mixture 98 of isotropically conductive matrix material 120 and anisotropically conductive particles 130 and may be a solid, or a bulk solid, at least at standard temperature and pressure. As illustrated in FIG. 2, isotropically conductive matrix material 120 may surround and/or encapsulate at least a portion, a majority, a substantial majority, or even all anisotropically conductive particles 130. Additionally or alternatively, anisotropically conductive particles 130 may be interspersed within isotropically conductive matrix material 120.

Isotropically conductive matrix material 120 may include any suitable material and/or composition that may be included in bulk matrix-particle composite 98, that may be electrically conductive, that may form a mixture with anisotropically conductive particles 130, and/or that may surround, support, and/or encapsulate the anisotropically conductive particles. Examples of isotropically conductive matrix material 120 include an electrically conductive material, an electrically conductive polymer, an electrically conductive glass, and/or a metal. As more specific examples, isotropically conductive matrix material 120 may include copper, may consist of copper, and/or may consist essentially of copper. However, other isotropically conductive matrix materials, such as other metals, also are within the scope of the present disclosure.

Anisotropically conductive particles 130 may include any suitable material and/or composition that may be included in bulk matrix-particle composite 98. This may include any suitable material and/or composition that may include and/or exhibit axis of enhanced electrical conductivity 170, that may form a mixture with isotropically conductive matrix material 120, and/or that may be surrounded by, supported by, and/or encapsulated by the isotropically conductive matrix material.

Figure 3:
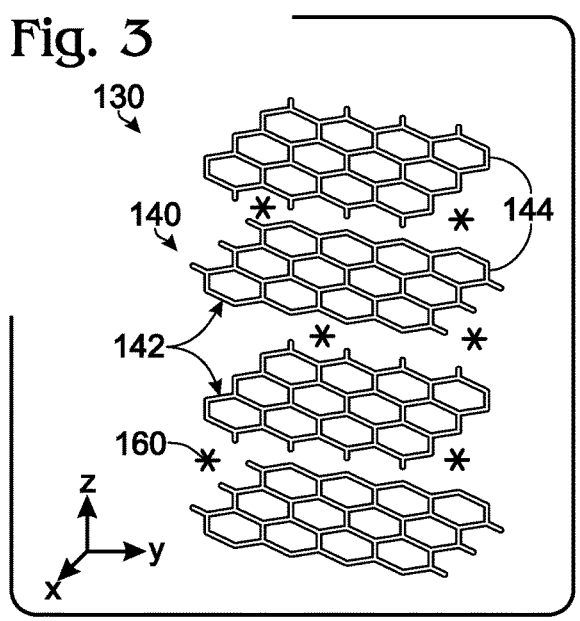
FIG. 3 is a schematic representation of an intercalated graphite domain that may be included in and/or utilized with the systems and methods according to the present disclosure.

As examples, and as illustrated schematically in FIG. 3, anisotropically conductive particles 130 may include, consist of, and/or consist essentially of a plurality of intercalated graphite domains 140. Intercalated graphite domains 140 may include, or be, any suitable form of doped graphite. As an example, intercalated graphite domains 140 may include a plurality of graphene layers 142 and an intercalated dopant

160. Each graphene layer 142 may have and/or define a respective surface plane 144; and, within a given intercalated graphite domain 140, surface planes 144 may be parallel, or at least substantially parallel, to one another. Stated another way, intercalated graphite domains 140 may include a plurality of graphene layers 142 that may define a layered stack of graphene layers 142. As another example, intercalated graphite domains 140 may include, or be, reduced graphene oxide and/or other appropriate graphitic materials. Additional examples of bulk matrix-particle composite 98, of anisotropically conductive particles 130, and/or of matrix material 120 are disclosed in U.S. patent application Ser. No. 14/151,229 entitled ELECTRICAL CONDUCTORS AND METHODS OF FORMING THEREOF, which was filed on Jan. 9, 2014, and in U.S. patent application Ser. No. 15/014,096 entitled SYSTEM AND METHOD OF FORMING ELECTRICAL INTERCONNECTS, which was filed on Feb. 3, 2016, the complete disclosures of which are hereby incorporated by reference.

Intercalated dopant 160 may be selected to enhance the electrical conductivity of intercalated graphite domains 140 relative to graphite domains that do not include intercalated dopant 160. This enhancement in electrical conductivity may cause intercalated graphite domains 140 to exhibit a high electrical conductivity, especially in a direction that is parallel to surface planes 144 (e.g., within the X-Y plane of FIG. 3). Stated another way, and when anisotropically conductive particles 130 include intercalated graphite domains 140, axis of enhanced electrical conductivity 170, which is illustrated in FIG. 2, may extend parallel to, at least substantially parallel to, and/or in any suitable direction within surface planes 144.

Intercalated dopant 160 may include, or be, any suitable dopant that may enhance the electrical conductivity of intercalated graphite domains 140. As examples, intercalated dopant 160 may include, or be, bromine, potassium, rubidium, cesium, lithium, iodine, chlorine, nitric acid, arsenic pentafluoride, sulfuric acid, antimony pentachloride, iron (iii) chloride, and/or aluminum chloride; however, other intercalated dopants 160 also are within the scope of the present disclosure.

Intercalated graphite domains 140 may exhibit relatively high electrical conductivities while, at the same time, being significantly lighter than common metallic electrical conductors. As examples, intercalated graphite domains 140 that include bromine as the dopant may exhibit bulk electrical conductivities between $3 \times 10^6$ siemens/m (S/m) and $1 \times 10^8$ S/m. This is comparable to the electrical conductivity of pure copper, for example, which is approximately $5.8 \times 10^7$ S/m. In addition, intercalated graphite domains 140 also have a density that is approximately one-fourth that of pure copper. Thus, intercalated graphite domains 140 may exhibit a bulk electrical conductivity that is comparable to pure copper but may be significantly lighter than pure copper.

Bulk matrix-particle composites 98 that include intercalated graphite domains 140 may exhibit bulk electrical conductivities between $5.5 \times 10^7$ siemens/m (S/m) and $1.45 \times 10^8$ S/m. This is a significant improvement when compared to the electrical conductivity of pure copper. In addition, and because intercalated graphite domains 140 are significantly lighter than pure copper, the bulk matrix-particle composite also may be significantly lighter than pure copper. As an example, a bulk matrix-particle composite that is 40 weight percent bromine intercalated graphite and 60 weight percent copper may exhibit an electrical conductivity of 1.45 S/c and a density of only 3.43 g/cm$^3$.

Figure 4:
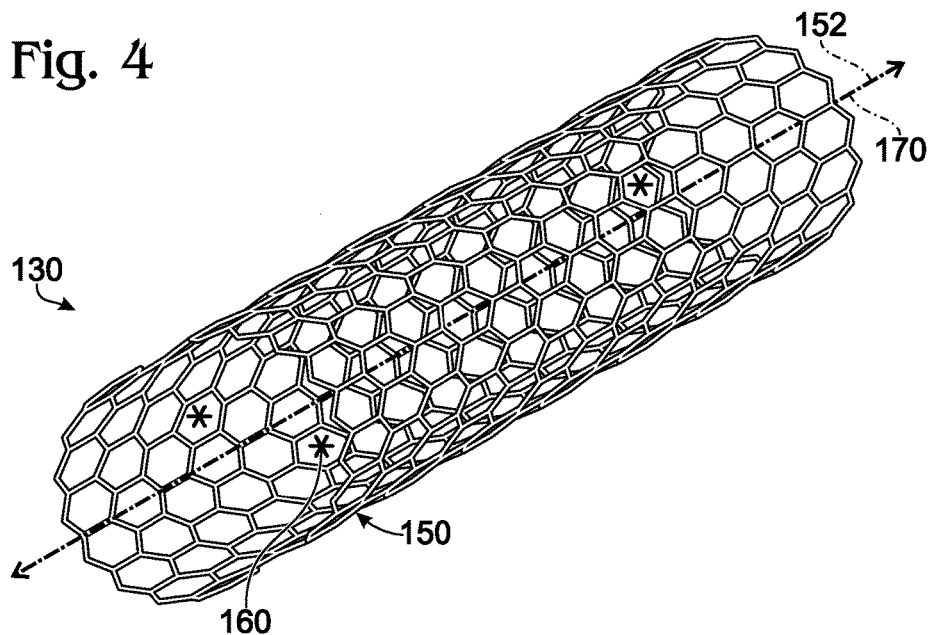
FIG. 4 is a schematic representation of a carbon nanotube that may be included in and/or utilized with the systems and methods according to the present disclosure.

As additional examples, and as illustrated in FIG. 4, anisotropically conductive particles 130 may include, consist of, and/or consist essentially of a plurality of carbon nanotubes 150. To enhance their conductivity, the carbon nanotubes may include a dopant 160. Examples of dopant 160 are disclosed herein with reference to intercalated dopant 160. As illustrated in FIG. 4, carbon nanotubes 150 may have and/or define a nanotube longitudinal axis 152, and axis of enhanced conductivity 170 may be along, at least substantially along, and/or parallel to nanotube longitudinal axis 152. Nanotube longitudinal axis 152 also may be referred to herein as, or may be, a nanotube elongate axis 152 and/or a nanotube elongated axis 152.

Returning to FIG. 1, it is within the scope of the present disclosure that the providing at 210 further may include selecting any suitable relative composition for the bulk matrix-particle composite based upon any suitable criteria. As an example, the providing at 210 may include selecting a weight percentage of the isotropically conductive matrix material (such as isotropically conductive matrix material 120 of FIG. 2) within the bulk matrix-particle composite (such as bulk matrix-particle composite 98 of FIG. 2), selecting a weight percentage of the anisotropically conductive particles (such as anisotropically conductive particles 130 of FIG. 2) within the bulk matrix-particle composite, and/or selecting an atomic percentage of the dopant (such as intercalated dopant 160 of FIGS. 3-4) within the plurality of anisotropically conductive particles. This selection may be based, at least in part, on a desired electrical conductivity of the elongated electrical conductor, upon a desired density of the elongated electrical conductor, and/or upon one or more desired mechanical properties of the elongated electrical conductor.

As examples, the weight percentage of the isotropically conductive matrix material within the bulk matrix-particle composite may be at least 40 wt %, at least 50 wt %, at least 60 wt %, at least 70 wt %, at least 80 wt %, and/or at least 90 wt %. Additionally or alternatively, the weight percentage of the isotropically conductive matrix material within the bulk matrix-particle composite may be at most 95 wt %, at most 90 wt %, at most 80 wt %, at most 70 wt %, and/or at most 60 wt %.

As additional examples, the weight percentage of the plurality of anisotropically conductive particles within the bulk matrix-particle composite may be at least 5 wt %, at least 10 wt %, at least 15 wt %, at least 20 wt %, at least 25 wt %, at least 30 wt %, at least 35 wt %, and/or at least 40 wt %. Additionally or alternatively, the weight percentage of the plurality of anisotropically conductive particles within the bulk matrix-particle composite may be at most 60 wt %, at most 50 wt %, at most 40 wt %, at most 30 wt %, at most 20 wt %, and/or at most 10 wt %.

As further examples, the atomic percentage of the dopant within the plurality of anisotropically conductive particles may be at least 1 at %, at least 2 at %, at least 3 at %, at least 4 at %, at least 5 at %, at least 6 at %, at least 7 at %, at least 8 at %, at least 9 at %, at least 10 at %, or at least 11 at %. Additionally or alternatively, the atomic percentage of the dopant within the plurality of anisotropically conductive particles may be at most 12 at %, at most 11 at %, at most 10 at %, at most 9 at %, at most 8 at %, at most 7 at %, at most 6 at %, at most 5 at %, at most 4 at %, at most 3 at %, or at most 2 at %.

Figure 5:
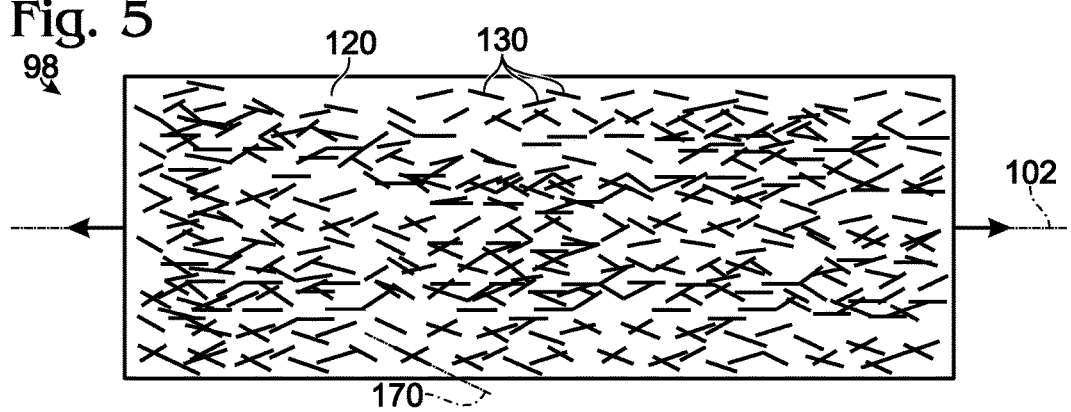
FIG. 5 is a schematic representation of a forming and/or aligning step in a method for defining an elongated electrical conductor according to the present disclosure.
Figure 6:
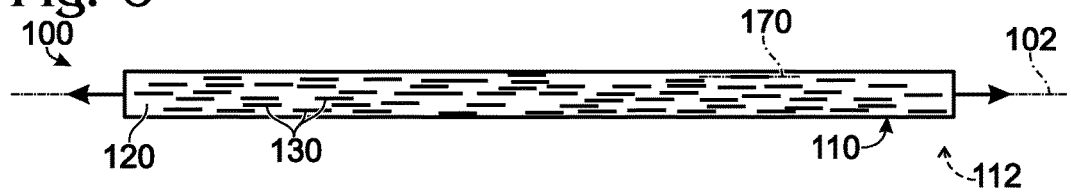
FIG. 6 is a schematic representation of an elongated electrical conductor according to the present disclosure.

With continued reference to FIG. 1, forming the bulk matrix-particle composite into the elongated electrical conductor at 220 may include forming the bulk matrix-particle composite into an elongated electrical conductor that has, exhibits, and/or defines a longitudinal axis. This may include lengthening the bulk matrix-particle composite, along the longitudinal axis, to form and/or define the elongated electrical conductor. This is illustrated in FIGS. 5-6. As illustrated in FIG. 5, bulk matrix-particle composite 98 may be lengthened, along a longitudinal axis 102, to define an elongated electrical conductor 100, which is illustrated in FIG. 6. The elongated electrical conductor 100 may include a conductor body 110, which defines longitudinal axis 102 and may be formed from isotropically conductive matrix material 120 and anisotropically conductive particles 130. Longitudinal axis 102 also may be referred to herein as, or may be, an elongate axis 102 and/or an elongated axis 102.

Figure 7:
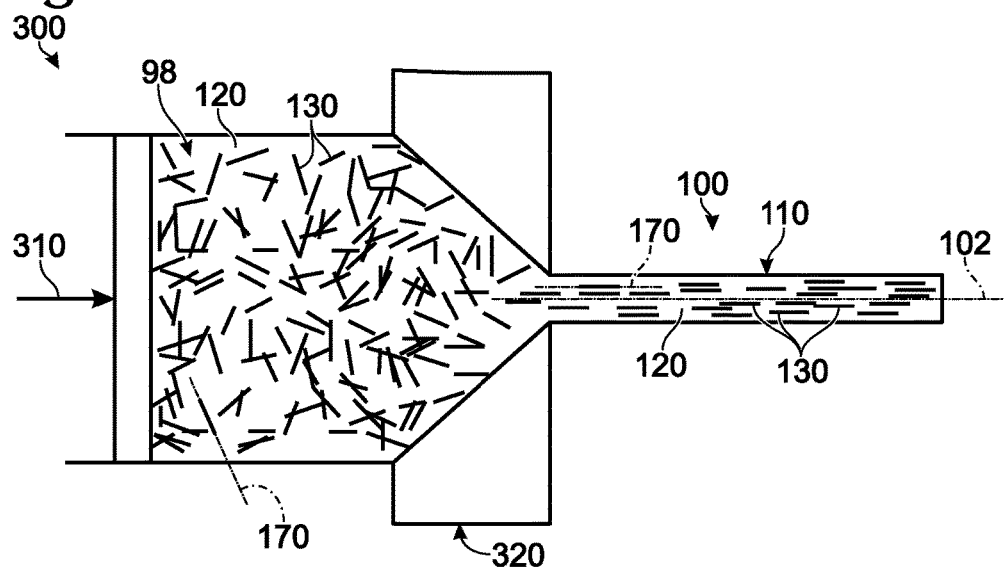
FIG. 7 is a schematic representation of an extrusion process that may be utilized to define an elongated electrical conductor according to the present disclosure.

The forming at 220 may be accomplished in any suitable manner. As an example, and as illustrated in FIG. 7, the forming at 220 may include utilizing an extrusion process 300. Under these conditions, an extrusion force 310 may be utilized to push bulk matrix-particle composite 98 through an extrusion die 320 and/or to extrude bulk matrix-particle composite 98 through extrusion die 320, thereby forming and/or defining elongated electrical conductor 100.

Figure 8:
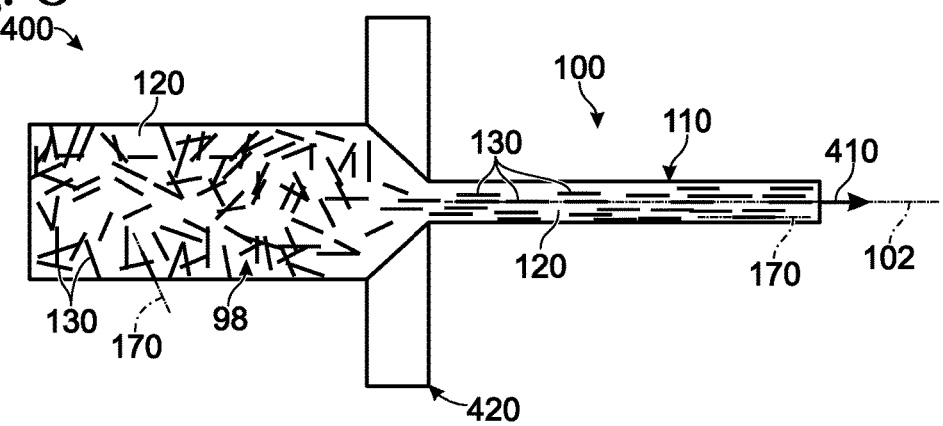
FIG. 8 is a schematic representation of a drawing and/or pultrusion process that may be utilized to define an elongated electrical conductor according to the present disclosure.

As another example, and as illustrated in FIG. 8, the forming at 220 may include utilizing a drawing process and/or a pultrusion process 400. Under these conditions, a drawing and/or a pultrusion force 410 may be utilized to pull bulk matrix-particle composite 98 through a drawing and/or pultrusion die 420, thereby forming and/or defining elongated electrical conductor 100.

As yet another example, the forming at 220 may include filling a hollow tube, or a hollow glass tube, with the bulk matrix-particle composite to define a composite-filled tube that defines a tube longitudinal axis. The forming at 220 further may include heating the composite-filled tube and then stretching the composite-filled tube, along the tube longitudinal axis, to lengthen the composite-filled tube and/or to define the elongated electrical conductor. Subsequently, the forming at 220 further may include separating the elongated electrical conductor from the hollow tube.

Figure 9:
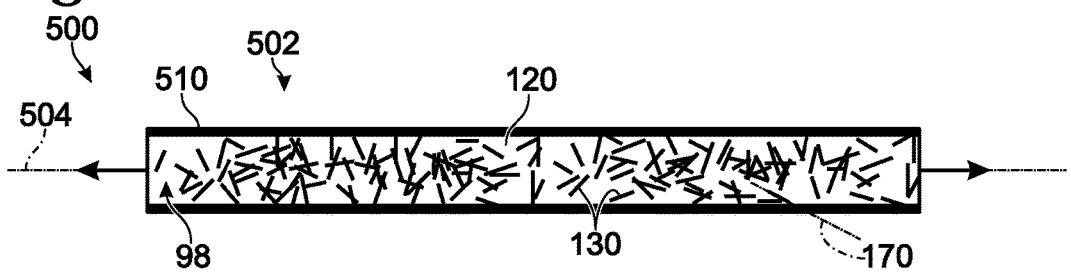
FIG. 9 is a schematic representation of a tube drawing process that may be utilized to define an elongated electrical conductor according to the present disclosure.
Figure 10:
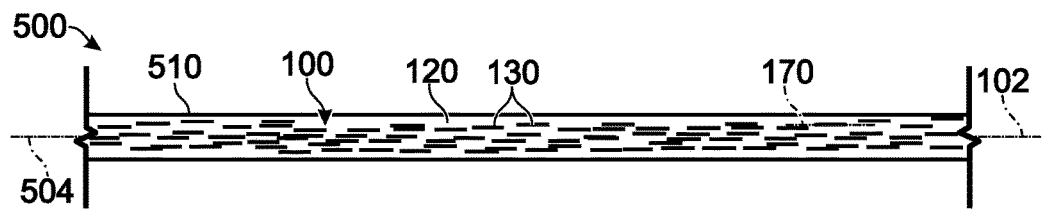
FIG. 10 is another schematic representation of the tube drawing process of FIG. 9.
Figure 11:
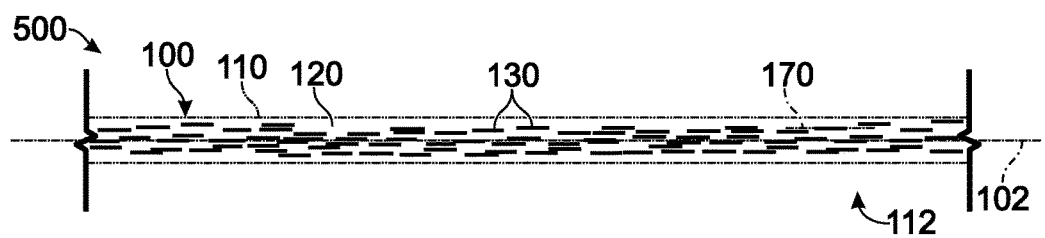
FIG. 11 is another schematic representation of the tube drawing process of FIGS. 9-10.

This is illustrated in FIGS. 9-11 and may be referred to herein as a Taylor method 500, as a Taylor process 500, and/or as a process 500. As illustrated in FIG. 9, a hollow tube 510 may be filled with bulk matrix-particle composite 98 to define a composite-filled tube 502 that defines a tube longitudinal axis 504, which also may be referred to herein as, or may be, an elongate axis 504 and/or an elongated axis 504. Composite-filled tube 502 then may be heated and, as illustrated in FIG. 10, stretched along tube longitudinal axis 504 to form and/or define elongated electrical conductor 100. Then, and as illustrated in FIG. 11, elongated electrical conductor 100 may be separated from hollow tube 510.

Aligning the anisotropically conductive particles at 230 may include aligning the plurality of anisotropically conductive particles that are present within the bulk matrix-particle composite and/or that are present within the elongated electrical conductor. This may include aligning the plurality of anisotropically conductive particles such that the axis of enhanced electrical conductivity of each of the anisotropically conductive particles is aligned with, or at least substantially aligned with, the longitudinal axis of the elongated electrical conductor. Such alignment of the axis of enhanced electrical conductivity may increase the electrical conductivity of the elongated electrical conductor along the longitudinal axis thereof to a value that is greater than the electrical conductivity of the bulk matrix-particle composite.

It is within the scope of the present disclosure that the aligning at 230 may be accomplished in any suitable manner and/or with any suitable sequence during methods 200. As an example, the aligning at 230 may be, or may be performed, concurrently, or at least substantially concurrently, with the forming at 220. As another example, the aligning at 230 may be responsive to, or a result of, the forming at 220, such as when the forming at 220 produces and/or generates the aligning at 230.

As a more specific example, and as illustrated in FIGS. 2 and 5-6, the lengthening of bulk matrix-particle composite 98 naturally may cause, produce, and/or generate alignment of axis of enhanced conductivity 170 of anisotropically conductive particles 130 along longitudinal axis 102 of elongated electrical conductor 100 to produce an elongated conductor with conductivity greater than $1.45 \times 10^8$ S/m. As another more specific example, and as illustrated in FIGS. 7 and 8, motion of bulk matrix-particle composite 98 through extrusion die 320 of FIG. 7 and/or through drawing and/or pultrusion die 420 of FIG. 8 naturally may cause, produce, and/or generate alignment of axis of enhanced conductivity 170 of anisotropically conductive particles 130 along longitudinal axis 102 of elongated electrical conductor 100. As yet another more specific example, and as illustrated in FIGS. 9-11, lengthening of composite-filled tube 502 along tube longitudinal axis 504 naturally may cause, produce, and/or generate alignment of axis of enhanced electrical conductivity 170 of anisotropically conductive particles 130 along longitudinal axis 102 of elongated electrical conductor 100.

Stated another way, the aligning at 230 may be the result of shearing, flowing, and/or deformation of bulk matrix-particle composite 98 during the forming at 220. However, this is not required, and it is within the scope of the present disclosure that the aligning at 230 may be performed prior to and/or subsequent to the forming at 220.

The aligning at 230 may include aligning to any suitable extent. As an example, the aligning at 230 may include aligning such that the respective axis of enhanced electrical conductivity of each of the plurality of anisotropically conductive particles is, or is on average, parallel, or at least substantially parallel, to the longitudinal axis of the elongated electrical conductor. As another example, the aligning at 230 may include aligning such that an average orientation of the plurality of anisotropically conductive particles enhances electrical conductivity of the elongated electrical conductor along the longitudinal axis thereof to greater than $1.45 \times 10^8$ S/m. As yet another example, the aligning at 230 may include aligning such that an electrical conductivity of the elongated electrical conductor, as measured along the longitudinal axis thereof, is greater than an electrical conductivity of the bulk matrix-particle composite.

Figure 12:
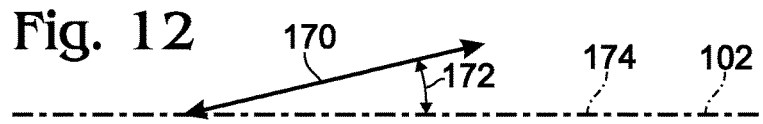
FIG. 12 is a schematic representation of an angle between an axis of enhanced conductivity and a longitudinal axis of an electrical conductor that may be utilized to describe the structure of elongated electrical conductors according to the present disclosure.

As a more specific example, and as illustrated in FIG. 12, the aligning at 230 may include aligning such that an average, or mean, value of an angle 172 of intersection between the respective axis of enhanced electrical conductivity 170 of each of the anisotropically conductive particles and a corresponding line 174, which is parallel to longitudinal axis 102 of the elongated electrical conductor, is less than a threshold average angle. Examples of the threshold average angle include threshold average angles of less than 30 degrees, less than 25 degrees, less than 20 degrees, less than 15 degrees, less than 10 degrees, less than 5 degrees, and/or less than 1 degree.

As discussed herein with reference to intercalated graphite domains 140 of FIG. 3, the bulk electrical conductivity of intercalated graphite domains 140 may approach that of metals, such as copper. In addition, the electrical conductivity of intercalated graphite domains 140 may be significantly higher than the bulk electrical conductivity thereof when measured in the direction of surface planes 144 of FIG. 3 (i.e., in the direction of enhanced electrical conductivity 170 of FIG. 1). As such, the aligning at 230 may produce and/or generate elongated electrical conductors that have greatly enhanced electrical conductivities when compared to the bulk matrix-particle composite. Stated another way, alignment of axis of enhanced conductivity 170 of anisotropically conductive particles 130 along longitudinal axis 102 of elongated electrical conductor 100 may decrease a resistance to electric current flow through elongated electrical conductor 100 and along longitudinal axis 102 thereof.

As also discussed, the density of intercalated graphite domains 140 may be significantly less than many metals, such as coper. As such, the aligning at 230 may produce and/or generate elongated electrical conductors that may have greatly enhanced electrical conductivities when compared to many metal conductors, that may be significantly lighter than many metal conductors, and/or that may have a greatly enhanced conductivity-to-density ratio when compared to many metal conductors.

Figure 13:
FIG. 13 is a schematic representation of another elongated electrical conductor according to the present disclosure.

Subsequent to the forming at 220 and to the aligning at 230, and regardless of the exact mechanism by which the forming at 220 and/or the aligning at 230 are performed, elongated electrical conductor 100 also may be referred to herein as a wire, as a conductive wire, as an electrically conductive wire, and/or as an elongated wire 112, as illustrated in FIGS. 6, 11, and 13. Stated another way, the forming at 220 may include forming the bulk matrix-particle composite into the wire, into the conductive wire, into the electrically conductive wire, and/or into the elongated wire. Elongated electrical conductor 100, or wire 112, additionally or alternatively may include, or be, any suitable electrical conductor that has and/or defines longitudinal axis 102. As examples, elongated electrical conductor 100, or wire 112, also may be referred to herein as, or may be, a rod, an elongate rod, an elongated rod, a lightning rod, a bar, a strap, a trace, a pillar, a via, a contact, and/or a shunt.

Elongated electrical conductor 100 may have and/or define a circular, or at least substantially circular, transverse cross-sectional shape. Stated another way, the forming at 220 may include forming such that the elongated electrical conductor has the circular, or at least substantially circular, transverse cross-sectional shape.

It is within the scope of the present disclosure that the elongated electrical conductor may have and/or define any suitable diameter, or effective diameter, and/or that the forming at 220 may include forming the elongated electrical conductor with the suitable diameter and/or effective diameter. As examples, the diameter, or effective diameter, may be at least 0.5 millimeters (mm), at least 0.75 mm, at least 1 mm, at least 1.25 mm, at least 1.5 mm, at least 1.75 mm, at least 2 mm, at least 2.5 mm, and/or at least 3 mm. Additionally or alternatively, the diameter, or effective diameter, may be at most 4 mm, at most 3.5 mm, at most 3 mm, at most 2.5 mm, and/or at most 2 mm. However, diameters, or effective diameters, of less than 0.5 mm and/or of greater than 4 mm also are within the scope of the present disclosure.

Applying the dielectric coating at 240 may include applying any suitable dielectric coating to the external surface of the elongated electrical conductor and is illustrated in FIG. 13. As illustrated therein, elongated electrical conductor 100 includes a conductor body 110, and an external surface of the conductor body is coated, covered, and/or at least partially encapsulated by a dielectric coating 180. Such a configuration may electrically insulate elongated electrical conductor 100 from other electrical conductors that may be proximal to elongated electrical conductor 100 and/or may prevent inadvertent and/or unintended conduction of electrical current from and/or into elongated electrical conductor 100. Elongated electrical conductors 100 that are covered with dielectric coating 180 also may be referred to herein as an insulated wire 114. Examples of dielectric coating 180 include any suitable dielectric material, electrically insulating material, and/or electrically insulating polymer.

The applying at 240 additionally or alternatively may be referred to herein as, or may include, inserting the elongate electrical conductor into a length of dielectric tubing. Under these conditions, the length of dielectric tubing may be formed from any suitable dielectric material, examples of which are disclosed herein.

As discussed herein, elongated electrical conductors 100, according to the present disclosure, may exhibit several benefits over traditional electrical conductors, such as metal conductors and/or metal conductors that do not include anisotropically conductive particles 130. These benefits may include equivalent, or even enhanced, electrical conductivity when compared to traditional electrical conductors, reduced density when compared to traditional electrical conductors, and/or an enhanced conductivity-to-density ratio when compared to traditional electrical conductors. As such, it may be beneficial to utilize elongated electrical conductors 100, according to the present disclosure, in a variety of different applications.

Figure 14:
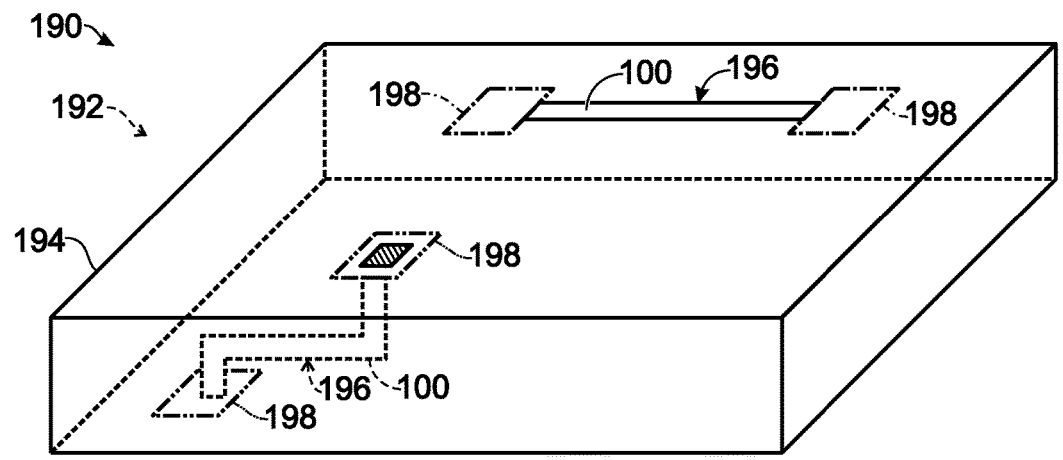
FIG. 14 is a schematic representation of an electronic component that may include and/or utilize an elongated electrical conductor according to the present disclosure.

As an example, FIG. 14 is a schematic representation of an electronic component 190, such as a printed circuit board 192, that may include and/or utilize elongated electrical conductors 100 according to the present disclosure. Electronic component 190 may include a dielectric support 194 and a plurality of electrically conductive traces 196 that may extend within dielectric support 194. One or more electrically conductive traces 196 may include, be, and/or be formed from an elongated electrical conductor 100 according to the present disclosure. In the example of FIG. 14, electronic component 190 further may include a plurality of pads, or contact pads 198, and electrically conductive traces 196 may extend between corresponding contact pads 198.

Figure 15:
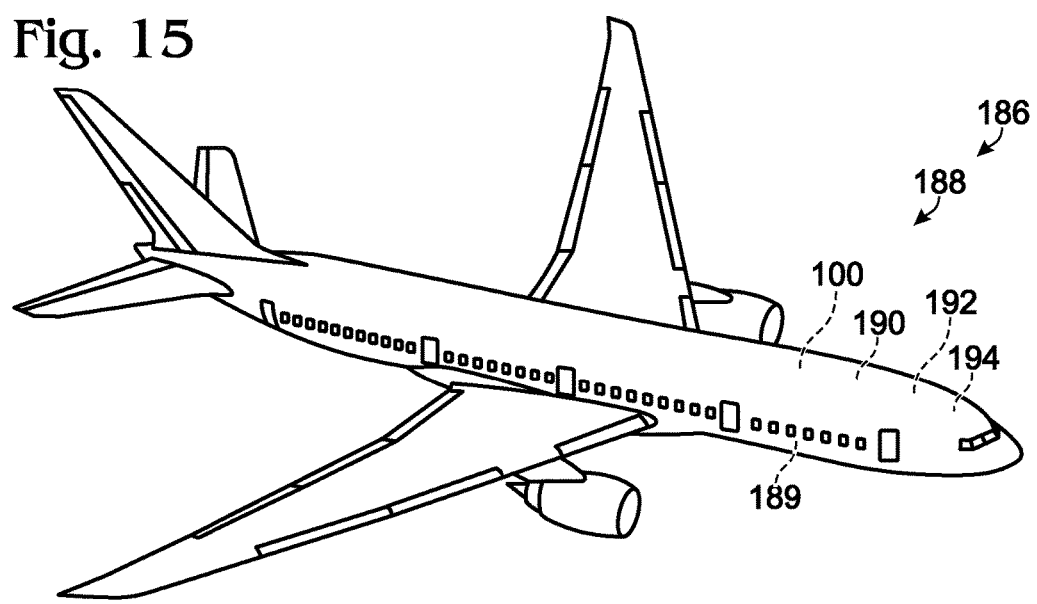
FIG. 15 is a schematic representation of a vehicle that may include and/or utilize an elongated electrical conductor according to the present disclosure.

As another example, FIG. 15 is a schematic representation of a vehicle 186, such as an aircraft 188, that may include and/or utilize elongated electrical conductors 100 according to the present disclosure. As an example, elongated electrical conductors 100 of FIGS. 6, 11, and/or 13 may be utilized to electrically interconnect various components of vehicle 186, to shield vehicle 186 from static electricity and/or electromagnetic interference (EMI)/radio frequency interference (RFI), and/or to shield one or more electrical components of vehicle 186 from lightning strike direct or indirect effects. As another example, vehicle 186 may include one or more electronic components 190 and/or printed circuit boards 192 of FIG. 14.

It is within the scope of the present disclosure that elongated electrical conductors 100 disclosed herein may be utilized in additive manufacturing processes, such as fused deposition modeling process. As an example, and with reference to FIG. 14, an additive manufacturing process may form both dielectric support 194 and electrically conductive traces 196 and be utilized to sequentially build up electronic components 190 and/or printed circuit boards 192 according to the present disclosure.

In this example, electrically conductive traces 196 may be, but are not required to be, formed in a layer-by-layer fashion, with various layers being utilized to increase a cross-sectional area of a given electrically conductive trace 196 and/or to define portions of the electrically conductive trace that extend in different directions. It is within the scope of the present disclosure that a composition of electrically conductive traces 196 may be uniform, or at least substantially uniform, across a transverse cross-section and/or along a length thereof. Alternatively, and when the electrically conductive trace is formed in the layer-by-layer fashion, it is also within the scope of the present disclosure that the composition of the electrically conductive trace may vary across the transverse cross-section and/or along the length thereof. As an example, a concentration of the anisotropically conductive particles within electrically conductive traces 196 may vary, may purposefully vary, and/or may systematically vary across the transverse cross-section and/or along the length thereof. Such a configuration may permit forming of electrically conductive traces with controlled, regulated, and/or specified electrical properties, such as resistance, across the transverse cross-section and/or along the length thereof.

As another example, and with reference to FIG. 15, one or more components of vehicle 186 and/or of aircraft 188 may be formed via the additive manufacturing process. As a more specific example, an external surface, or skin, 189 of vehicle 186 may be formed via an additive manufacturing process in which both dielectric support 194 and elongated electrical conductors 100 are sequentially applied to form and/or define skin 189. Such a configuration may permit skin 189 to function as an electrical shield for vehicle 186 and/or may permit one or more electric currents to be conveyed, via skin 189, between various portions and/or regions of vehicle 186.

Examples of inventive subject matter according to the present disclosure are described in the following enumerated paragraphs:

A1. A method of defining an elongated electrical conductor, the method comprising:

providing a bulk matrix-particle composite including:

(i) an isotropically conductive, or at least substantially isotropically conductive, matrix material; and (ii) a plurality of anisotropically conductive particles, wherein each anisotropically conductive particle in the plurality of anisotropically conductive particles defines a respective axis of enhanced electrical conductivity, wherein an electrical conductivity of each anisotropically conductive particle is greater along the respective axis of enhanced electrical conductivity than the electrical conductivity of the anisotropically conductive particle in at least one other direction that is different from the respective axis of enhanced electrical conductivity;

forming the bulk matrix-particle composite into an elongated electrical conductor that defines a longitudinal axis; and aligning the plurality of anisotropically conductive particles such that the respective axis of enhanced electrical conductivity of each of the plurality of anisotropically conductive particles is aligned with, or at least substantially aligned with, the longitudinal axis of the elongated electrical conductor.

A2. The method of paragraph A1, wherein the providing includes providing such that (or wherein, prior to the aligning,) the respective axis of enhanced electrical conductivity of each of the plurality of anisotropically conductive particles is random, or at least substantially random, within the bulk matrix-particle composite.

A3. The method of any of paragraphs A1-A2, wherein the providing includes providing such that at least one of:

(i) the bulk matrix-particle composite is a mixture of the isotropically conductive matrix material and the plurality of anisotropically conductive particles;

(ii) the isotropically conductive matrix material surrounds the plurality of anisotropically conductive particles within the bulk matrix-particle composite;

(iii) the isotropically conductive matrix material encapsulates the plurality of anisotropically conductive particles within the bulk matrix-particle composite; and (iv) the plurality of anisotropically conductive particles is interspersed within the isotropically conductive matrix material.

A4. The method of any of paragraphs A1-A3, wherein the providing includes providing such that bulk matrix-particle composite is a bulk solid.

A5. The method of any of paragraphs A1-A4, wherein the providing includes providing such that the isotropically conductive matrix material includes at least one of an electrically conductive material, an electrically conductive polymer, an electrically conductive glass, and a metal.

A6. The method of any of paragraphs A1-A5, wherein the providing includes providing such that the isotropically conductive matrix material at least one of includes copper, consists of copper, and consists essentially of copper.

A7. The method of any of paragraphs A1-A6, wherein the providing includes providing such that the plurality of anisotropically conductive particles at least one of includes a plurality of intercalated graphite domains, consists of a plurality of intercalated graphite domains, and consists essentially of a plurality of intercalated graphite domains.

A8. The method of paragraph A7, wherein the providing includes providing such that each of the plurality of intercalated graphite domains includes an intercalated dopant, optionally wherein the intercalated dopant is selected to enhance the electrical conductivity of the intercalated graphite domains along the axis of enhanced electrical conductivity.

A9. The method of paragraph A8, wherein the providing includes providing such that the intercalated dopant includes, or is, bromine.

A10. The method of any of paragraphs A7-A9, wherein each of the plurality of intercalated graphite domains includes a plurality of graphene layers, wherein each of the plurality of graphene layers defines a respective surface plane, wherein the respective surface plane of each of the plurality of graphene layers in a given intercalated graphite domain of the plurality of intercalated graphite domains is parallel, or at least substantially parallel, to the respective surface plane of each other graphene layer in the given intercalated graphite domain, and further wherein the axis of enhanced electrical conductivity of the given intercalated graphite domain is parallel, or at least substantially parallel, to the respective surface plane of each of the plurality of graphene layers.

A11. The method of any of paragraphs A1-A10, wherein the providing includes providing such that the plurality of anisotropically conductive particles at least one of includes a plurality of carbon nanotubes, consists of a plurality of carbon nanotubes, and consists essentially of a plurality of carbon nanotubes.

A12. The method of paragraph A11, wherein the providing includes providing such that each of the plurality of carbon nanotubes includes an/the intercalated dopant, optionally wherein the intercalated dopant is selected to enhance an electrical conductivity of the plurality of carbon nanotubes.

A13. The method of paragraph A12, wherein the providing includes providing such that the intercalated dopant includes, or is, bromine.

A14. The method of any of paragraphs A11-A13, wherein each of the plurality of carbon nanotubes defines a respective nanotube longitudinal axis, and further wherein the axis of enhanced conductivity is along, or at least substantially along, the respective nanotube longitudinal axis of each of the plurality of carbon nanotubes.

A15. The method of any of paragraphs A1-A14, wherein the method further includes selecting a weight percentage of the isotropically conductive matrix material within the bulk matrix-particle composite based, at least in part, on at least one of a desired electrical conductivity of the elongated electrical conductor, a desired density of the elongated electrical conductor, and one or more desired mechanical properties of the elongated electrical conductor.

A16. The method of any of paragraphs A1-A15, wherein a/the weight percentage of the isotropically conductive matrix material within the bulk matrix-particle composite is at least one of:
(i) at least 40 wt %, at least 50 wt %, at least 60 wt %, at least 70 wt %, at least 80 wt %, or at least 90 wt %; and
(ii) at most 95 wt %, at most 90 wt %, at most 80 wt %, at most 70 wt %, or at most 60 wt %.

A17. The method of any of paragraphs A1-A16, wherein the method further includes selecting a weight percentage of the plurality of anisotropically conductive particles within the bulk matrix-particle composite based, at least in part, on at least one of a/the desired electrical conductivity of the elongated electrical conductor, a/the desired density of the elongated electrical conductor, and one or more desired mechanical properties of the elongated electrical conductor.

A18. The method of any of paragraphs A1-A17, wherein a/the weight percentage of the plurality of anisotropically conductive particles within the bulk matrix-particle composite is at least one of:
(i) at least 5 wt %, at least 10 wt %, at least 15 wt %, at least 20 wt %, at least 25 wt %, at least 30 wt %, at least 35 wt %, or at least 40 wt %; and
(ii) at most 60 wt %, at most 50 wt %, at most 40 wt %, at most 30 wt %, at most 20 wt %, or at most 10 wt %.

A19. The method of any of paragraphs A1-A18, wherein the method further includes selecting an atomic percentage of an/the intercalated dopant within the plurality of anisotropically conductive particles based, at least in part, on at least one of a/the desired electrical conductivity of the elongated electrical conductor, a/the desired density of the elongated electrical conductor, and one or more desired mechanical properties of the elongated electrical conductor.

A20. The method of any of paragraphs A1-A19, wherein a/the atomic percentage of an/the intercalated dopant within the plurality of anisotropically conductive particles is at least one of:
(i) at least 1 at %, at least 2 at %, at least 3 at %, at least 4 at %, at least 5 at %, at least 6 at %, at least 7 at %, at least 8 at %, at least 9 at %, at least 10 at %, or at least 11 at %; and
(ii) at most 12 at %, at most 11 at %, at most 10 at %, at most 9 at %, at most 8 at %, at most 7 at %, at most 6 at %, at most 5 at %, at most 4 at %, at most 3 at %, or at most 2 at %.

A21. The method of any of paragraphs A1-A20, wherein the forming includes lengthening the bulk matrix-particle composite, along the longitudinal axis, to define the elongated electrical conductor.

A22. The method of any of paragraphs A1-A21, wherein the forming includes at least one of:
(i) extruding the bulk matrix-particle composite through an extrusion die;
(ii) drawing the bulk matrix-particle composite through a drawing die; and
(iii) pultruding the bulk matrix-particle composite through a pultrusion die.

A23. The method of any of paragraphs A1-A22, wherein the forming includes:
(i) filling a hollow tube with the bulk matrix-particle composite to define a composite-filled tube that defines a tube longitudinal axis;
(ii) heating the composite-filled tube;
(iii) stretching the composite-filled tube, along the tube longitudinal axis, to lengthen the composite-filled tube and define the elongated electrical conductor; and
(iv) optionally separating the elongated electrical conductor from the hollow tube.

A24. The method of any of paragraphs A1-A23, wherein the hollow tube includes a hollow glass tube.

A25. The method of any of paragraphs A1-A24, wherein the elongated electrical conductor includes, or is, a conductive wire.

A26. The method of any of paragraphs A1-A25, wherein the forming includes forming such that the elongated electrical conductor has a circular, or at least substantially circular, transverse cross-sectional shape.

A27. The method of any of paragraphs A1-A26, wherein the forming includes forming such that a diameter, or an effective diameter, of the elongated electrical conductor is at least one of:
(i) at least 0.5 millimeters (mm), at least 0.75 mm, at least 1 mm, at least 1.25 mm, at least 1.5 mm, at least 1.75 mm, at least 2 mm, at least 2.5 mm, or at least 3 mm; and
(ii) at most 4 mm, at most 3.5 mm, at most 3 mm, at most 2.5 mm, or at most 2 mm.

A28. The method of any of paragraphs A1-A27, wherein the aligning is concurrent, or at least substantially concurrent, with the forming.

A29. The method of any of paragraphs A1-A28, wherein the aligning is responsive to the forming.

A30. The method of any of paragraphs A1-A29, wherein the forming generates the aligning.

A31. The method of any of paragraphs A1-A30, wherein the aligning includes aligning such that the respective axis of enhanced electrical conductivity of each of the plurality of anisotropically conductive particles is parallel, or at least substantially parallel, to the longitudinal axis of the elongated electrical conductor.

A32. The method of any of paragraphs A1-A31, wherein the aligning includes aligning such that an average value of an angle of intersection between the respective axis of enhanced electrical conductivity of each of the plurality of anisotropically conductive particles and a corresponding line that is parallel to the longitudinal axis of the elongated electrical conductor is less than a threshold average angle.

A33. The method of paragraph A32, wherein the threshold average angle is less than 30 degrees, less than 25 degrees, less than 20 degrees, less than 15 degrees, less than 10 degrees, less than 5 degrees, or less than 1 degree.

A34. The method of any of paragraphs A1-A33, wherein the aligning includes aligning such that an average orientation of the plurality of anisotropically conductive particles enhances electrical conduction along the longitudinal axis of the elongated electrical conductor.

A35. The method of any of paragraphs A1-A34, wherein the aligning includes aligning such that an electrical conductivity of the elongated electrical conductor, as measured along the longitudinal axis thereof, is greater than an electrical conductivity of the bulk matrix-particle composite.

A36. The method of any of paragraphs A1-A35, wherein the method further includes applying a dielectric coating to an external surface of the elongated electrical conductor.

A37. An elongated electrical conductor formed by the method of any of paragraphs A1-A36.

B1. An elongated electrical conductor, comprising:
a conductor body defining a longitudinal axis, wherein the conductor body includes:
(i) an isotropically conductive matrix material; and
(ii) a plurality of anisotropically conductive particles interspersed within the isotropically conductive matrix material, wherein each anisotropically conductive particle in the plurality of anisotropically conductive particles defines a respective axis of enhanced electrical conductivity, and further wherein the axis of enhanced electrical conductivity of each of the plurality of anisotropically conductive particles is aligned with, or at least substantially aligned with, the longitudinal axis of the conductor body.

B2. The elongated electrical conductor of paragraph B1, wherein the conductor body defines a conductive wire.

B3. The elongated electrical conductor of any of paragraphs B1-B2, wherein the conductor body has a circular, or at least substantially circular, transverse cross-sectional shape.

B4. The elongated electrical conductor of any of paragraphs B1-B3, wherein the conductor body has a diameter, or an effective diameter, of at least one of:
(i) at least 0.5 millimeters (mm), at least 0.75 mm, at least 1 mm, at least 1.25 mm, at least 1.5 mm, at least 1.75 mm, at least 2 mm, at least 2.5 mm, or at least 3 mm; and
(ii) at most 4 mm, at most 3.5 mm, at most 3 mm, at most 2.5 mm, or at most 2 mm.

B5. The elongated electrical conductor of any of paragraphs B1-B4, wherein the elongated electrical conductor further includes a dielectric coating that covers an external surface of the conductor body.

B6. The elongated electrical conductor of any of paragraphs B1-B5, wherein the isotropically conductive matrix material includes at least one of an electrically conductive polymer, an electrically conductive glass, and a metal.

B7. The elongated electrical conductor of any of paragraphs B1-B6, wherein the isotropically conductive matrix material at least one of includes copper, consists of copper, and consists essentially of copper.

B8. The elongated electrical conductor of any of paragraphs B1-B7, wherein the plurality of anisotropically conductive particles at least one of includes a plurality of intercalated graphite domains, consists of a plurality of intercalated graphite domains, and consists essentially of a plurality of intercalated graphite domains.

B9. The elongated electrical conductor of paragraph B8, wherein each of the plurality of intercalated graphite domains includes an intercalated dopant, optionally wherein the intercalated dopant is selected to enhance the electrical conductivity of the intercalated graphite domains in the axis of enhanced electrical conductivity.

B10. The elongated electrical conductor of paragraph B9, wherein the intercalated dopant includes, or is, bromine.

B11. The elongated electrical conductor of any of paragraphs B8-B10, wherein each of the plurality of intercalated graphite domains includes a plurality of graphene layers, wherein each of the plurality of graphene layers defines a respective surface plane, wherein the respective surface plane of each of the plurality of graphene layers in a given intercalated graphite domain of the plurality of intercalated graphite domains is parallel, or at least substantially parallel, to the respective surface plane of each other graphene layer in the given intercalated graphite domain, and further wherein the axis of enhanced electrical conductivity of the given intercalated graphite domain is parallel, or at least substantially parallel, to the respective surface plane of each of the plurality of graphene layers.

B12. The elongated electrical conductor of any of paragraphs B1-B11, wherein the plurality of anisotropically conductive particles at least one of includes a plurality of carbon nanotubes, consists of a plurality of carbon nanotubes, and consists essentially of a plurality of carbon nanotubes.

B13. The elongated electrical conductor of paragraph B12, wherein each of the plurality of carbon nanotubes includes an/the intercalated dopant, optionally wherein the intercalated dopant is selected to enhance an electrical conductivity of the plurality of carbon nanotubes.

B14. The elongated electrical conductor of paragraph B13, wherein the intercalated dopant includes, or is, bromine.

B15. The elongated electrical conductor of any of paragraphs B12-B14, wherein each of the plurality of carbon nanotubes defines a respective nanotube longitudinal axis, and further wherein the axis of enhanced conductivity is along, or at least substantially along, the respective nanotube longitudinal axis of each of the plurality of carbon nanotubes.

B16. The elongated electrical conductor of any of paragraphs B1-1315, wherein a/the weight percentage of the isotropically conductive matrix material within the bulk matrix-particle composite is at least one of:
(i) at least 40 wt %, at least 50 wt %, at least 60 wt %, at least 70 wt %, at least 80 wt %, or at least 90 wt %; and
(ii) at most 95 wt %, at most 90 wt %, at most 80 wt %, at most 70 wt %, or at most 60 wt %.

B17. The elongated electrical conductor of any of paragraphs B1-B16, wherein a weight percentage of the plurality of anisotropically conductive particles within the bulk matrix-particle composite is at least one of:
(i) at least 5 wt %, at least 10 wt %, at least 15 wt %, at least 20 wt %, at least 25 wt %, at least 30 wt %, at least 35 wt %, or at least 40 wt %; and
(ii) at most 60 wt %, at most 50 wt %, at most 40 wt %, at most 30 wt %, at most 20 wt %, or at most 10 wt %.

B18. The elongated electrical conductor of any of paragraphs B1-B17, wherein an atomic percentage of a/the dopant within the plurality of anisotropically conductive particles is at least one of:
(i) at least 1 at %, at least 2 at %, at least 3 at %, at least 4 at %, at least 5 at %, at least 6 at %, at least 7 at %, at least 8 at %, at least 9 at %, at least 10 at %, or at least 11 at %; and
(ii) at most 12 at %, at most 11 at %, at most 10 at %, at most 9 at %, at most 8 at %, at most 7 at %, at most 6 at %, at most 5 at %, at most 4 at %, at most 3 at %, or at most 2 at %.

B19. The elongated electrical conductor of any of paragraphs B1-B18, wherein the respective axis of enhanced electrical conductivity of each of the plurality of anisotropically conductive particles is parallel, or at least substantially parallel, to the longitudinal axis of the elongated electrical conductor.

B20. The elongated electrical conductor of any of paragraphs B1-B19, wherein an average value of an angle of intersection between the respective axis of enhanced electrical conductivity of each of the plurality of anisotropically conductive particles and a corresponding line that is parallel to the longitudinal axis of the elongated electrical conductor is less than a threshold average angle.

B21. The elongated electrical conductor of paragraph B20, wherein the threshold average angle is less than 30 degrees, less than 25 degrees, less than 20 degrees, less than 15 degrees, less than 10 degrees, less than 5 degrees, or less than 1 degree.

B22. The elongated electrical conductor of any of paragraphs B1-B21, wherein an average orientation of the plurality of anisotropically conductive particles enhances electrical conduction along the longitudinal axis of the elongated electrical conductor.

B23. An electronic component, comprising:
a dielectric support; and
a plurality of electrically conductive traces extending within the dielectric support, wherein at least a subset of the plurality of electrically conductive traces includes the elongated electrical conductor of any of paragraphs B1-B22.

B24. A printed circuit board, comprising:
a dielectric support; and
a plurality of electrically conductive traces extending within the dielectric support, wherein at least a subset of the plurality of electrically conductive traces includes the elongated electrical conductor of any of paragraphs B1-B22.

B25. A vehicle including the elongated electrical conductor of any of paragraphs B1-B22, the electronic component of paragraph B23, or the printed circuit board of paragraph B24.

B26. An aircraft including the elongated electrical conductor of any of paragraphs B1-B22, the electronic component of paragraph B23, or the printed circuit board of paragraph B24.

As used herein, the terms "selective" and "selectively," when modifying an action, movement, configuration, or other activity of one or more components or characteristics of an apparatus, mean that the specific action, movement, configuration, or other activity is a direct or indirect result of user manipulation of an aspect of, or one or more components of, the apparatus.

As used herein, the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa. Similarly, subject matter that is recited as being configured to perform a particular function may additionally or alternatively be described as being operative to perform that function.

As used herein, the phrase "at least one," in reference to a list of one or more entities should be understood to mean at least one entity selected from any one or more of the entity in the list of entities, but not necessarily including at least one of each and every entity specifically listed within the list of entities and not excluding any combinations of entities in the list of entities. This definition also allows that entities may optionally be present other than the entities specifically identified within the list of entities to which the phrase "at least one" refers, whether related or unrelated to those entities specifically identified. Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including entities other than B); in another embodiment, to at least one, optionally including more than one, B, with no A present (and optionally including entities other than A); in yet another embodiment, to at least one, optionally including more than one, A, and at least one, optionally including more than one, B (and optionally including other entities). In other words, the phrases "at least one," "one or more," and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" may mean A alone, B alone, C alone, A and B together, A and C together, B and C together, A, B and C together, and optionally any of the above in combination with at least one other entity.

The various disclosed elements of apparatuses and steps of methods disclosed herein are not required to all apparatuses and methods according to the present disclosure, and the present disclosure includes all novel and non-obvious combinations and subcombinations of the various elements and steps disclosed herein. Moreover, one or more of the various elements and steps disclosed herein may define independent inventive subject matter that is separate and apart from the whole of a disclosed apparatus or method. Accordingly, such inventive subject matter is not required to be associated with the specific apparatuses and methods that are expressly disclosed herein, and such inventive subject matter may find utility in apparatuses and/or methods that are not expressly disclosed herein.

As used herein, the phrase, "for example," the phrase, "as an example," and/or simply the term "example," when used with reference to one or more components, features, details, structures, embodiments, and/or methods according to the present disclosure, are intended to convey that the described component, feature, detail, structure, embodiment, and/or method is an illustrative, non-exclusive example of components, features, details, structures, embodiments, and/or methods according to the present disclosure. Thus, the described component, feature, detail, structure, embodiment, and/or method is not intended to be limiting, required, or exclusive/exhaustive; and other components, features, details, structures, embodiments, and/or methods, including structurally and/or functionally similar and/or equivalent components, features, details, structures, embodiments, and/or methods, are also within the scope of the present disclosure.

The invention claimed is:

1. An elongated electrical conductor, comprising:
a conductor body defining a longitudinal axis, wherein the conductor body includes:
(i) an isotropically conductive matrix material; and
(ii) a plurality of anisotropically conductive particles interspersed within the isotropically conductive matrix material, wherein each anisotropically conductive particle in the plurality of anisotropically conductive particles defines a respective axis of enhanced electrical conductivity, and further wherein the respective axis of enhanced electrical conductivity of each of the plurality of anisotropically conductive particles is at least substantially aligned with the longitudinal axis of the conductor body.

2. A method of defining the elongated electrical conductor of claim 1, the method comprising:
providing a bulk matrix-particle composite including:
(i) the isotropically conductive matrix material; and
(ii) the plurality of anisotropically conductive particles, wherein an electrical conductivity of each anisotropically conductive particle is greater along the respective axis of enhanced electrical conductivity than the electrical conductivity of the anisotropically conductive particle in at least one other direction that is different from the respective axis of enhanced electrical conductivity;
forming the bulk matrix-particle composite into the elongated electrical conductor; and
aligning the plurality of anisotropically conductive particles such that the respective axis of enhanced electrical conductivity of each of the plurality of anisotropically conductive particles is at least substantially aligned with the longitudinal axis of the elongated electrical conductor.

3. The method of claim 2, wherein the method further includes selecting a weight percentage of the isotropically conductive matrix material within the bulk matrix-particle composite based, at least in part, on at least one of a desired electrical conductivity of the elongated electrical conductor, a desired density of the elongated electrical conductor, and one or more desired mechanical properties of the elongated electrical conductor.

4. The method of claim 2, wherein the forming includes lengthening the bulk matrix-particle composite, along the longitudinal axis, to define the elongated electrical conductor.

5. The method of claim 2, wherein the forming includes at least one of:
(i) extruding the bulk matrix-particle composite through an extrusion die;
(ii) drawing the bulk matrix-particle composite through a drawing die; and
(iii) pultruding the bulk matrix-particle composite through a pultrusion die.

6. The method of claim 2, wherein the aligning is at least substantially concurrent with the forming.

7. The method of claim 2, wherein the aligning is responsive to the forming.

8. The method of claim 2, wherein the aligning includes aligning such that the respective axis of enhanced electrical conductivity of each of the plurality of anisotropically conductive particles is at least substantially parallel to the longitudinal axis of the elongated electrical conductor.

9. The method of claim 2, wherein the aligning includes aligning such that an average value of an angle of intersection between the respective axis of enhanced electrical conductivity of each of the plurality of anisotropically conductive particles and a corresponding line that is parallel to the longitudinal axis of the elongated electrical conductor is less than 30 degrees.

10. The method of claim 2, wherein the aligning includes aligning such that an electrical conductivity of the elongated electrical conductor, as measured along the longitudinal axis thereof, is greater than an electrical conductivity of the bulk matrix-particle composite.

11. The method of claim 2, wherein the method further includes at least one of:

(i) applying a dielectric coating to an external surface of the elongated electrical conductor; and
(ii) inserting the elongate electrical conductor into a length of dielectric tubing.

12. An electronic component, comprising:
a dielectric support; and
a plurality of electrically conductive traces extending within the dielectric support, wherein at least a subset of the plurality of electrically conductive traces includes the elongated electrical conductor of claim 1.

13. A vehicle including the elongated electrical conductor of claim 1.

14. The elongated electrical conductor of claim 1, wherein the isotropically conductive matrix material consists essentially of copper.

15. The elongate electrical conductor of claim 1, wherein the plurality of anisotropically conductive particles consists essentially of a plurality of intercalated graphite domains.

16. The elongate electrical conductor of claim 15, wherein each of the plurality of intercalated graphite domains includes an intercalated dopant selected to enhance the electrical conductivity of the intercalated graphite domains along the axis of enhanced electrical conductivity.

17. The elongate electrical conductor of claim 15, wherein each of the plurality of intercalated graphite domains includes a plurality of graphene layers, wherein each of the plurality of graphene layers defines a respective surface plane, wherein the respective surface plane of each of the plurality of graphene layers in a given intercalated graphite domain of the plurality of intercalated graphite domains is parallel, or at least substantially parallel, to the respective surface plane of each other graphene layer in the given intercalated graphite domain, and further wherein the axis of enhanced electrical conductivity of the given intercalated graphite domain is at least substantially parallel to the respective surface plane of each of the plurality of graphene layers.

18. The elongate electrical conductor of claim 1, wherein the plurality of anisotropically conductive particles consists essentially of a plurality of carbon nanotubes.

19. The elongate electrical conductor of claim 18, wherein each of the plurality of carbon nanotubes includes an intercalated dopant selected to enhance an electrical conductivity of the plurality of carbon nanotubes.

20. The elongate electrical conductor of claim 1, wherein a weight percentage of the isotropically conductive matrix material within the bulk matrix-particle composite is at least 40 weight percent and at most 95 weight percent.

21. An electrically conductive wire, comprising:
a conductor body defining a longitudinal axis, wherein the conductor body includes:
(i) an isotropically conductive matrix material, wherein the isotropically conductive matrix material consists essentially of copper; and
(ii) a plurality of anisotropically conductive particles interspersed within the isotropically conductive matrix material, wherein the plurality of anisotropically conductive particles consists essentially of a plurality of intercalated graphite domains that includes an intercalated bromine dopant, wherein each anisotropically conductive particle in the plurality of anisotropically conductive particles defines a respective axis of enhanced electrical conductivity, and further wherein the respective axis of enhanced electrical conductivity of each of the plurality of anisotropically conductive particles is at least substantially aligned with the longitudinal axis of the conductor body; and a dielectric coating that covers an external surface of the conductor body.

\* \* \* \* \*